United States Patent [19]

Howell

[11] Patent Number: 4,620,122

[45] Date of Patent: Oct. 28, 1986

[54] PIEZOELECTRIC CONTACT DRIVER FOR CIRCUIT INTERRUPTERS

[75] Inventor: Edward K. Howell, Simsbury, Conn.

[73] Assignee: General Electric Company, New York, N.Y.

[21] Appl. No.: 759,710

[22] Filed: Jul. 29, 1985

[51] Int. Cl.[4] .............................................. H01L 41/08

[52] U.S. Cl. ...................................... 310/328; 335/14; 335/131; 200/181; 361/8

[58] Field of Search ................ 310/328, 323, 330–332; 200/181; 361/8, 13; 335/131, 14

[56] References Cited

U.S. PATENT DOCUMENTS

| | | | |
|---|---|---|---|
| 2,335,888 | 12/1943 | Stilwell, Jr. | 335/14 X |
| 2,365,738 | 12/1944 | Williams | 310/328 |
| 3,320,392 | 5/1967 | Mullen et al. | 335/131 X |
| 3,651,437 | 3/1972 | Kiyoshi | 335/131 |
| 4,454,442 | 6/1984 | Hosking | 310/328 |
| 4,473,859 | 9/1984 | Stone et al. | 200/181 |

*Primary Examiner*—Mark O. Budd
*Attorney, Agent, or Firm*—Richard A. Menelly; Walter C. Bernkopf; Fred Jacob

[57] ABSTRACT

A bridging contact abuts one end of a piezoelectric bar and is held across a pair of current carrying fixed contacts by means of a compression spring to assure a good electrical conductive path across the fixed contacts. To separate the contacts, a voltage pulse is applied to the piezoelectric bar in a direction transverse to its linear extent. The rapid expansion of the piezoelectric bar drives the bridging contact rapidly away from the fixed contact pair to interrupt the current therethrough.

1 Claim, 3 Drawing Figures

PIEZOELECTRIC CONTACT DRIVER FOR CIRCUIT INTERRUPTERS

BACKGROUND OF THE INVENTION

U.S. patent application Ser. No. 684,307 filed Dec. 20, 1984 and entitled "High Speed Contact Driver for Circuit Interruption Devices" in the name of E. K. Howell describes the use of a bridging contact to make and break electrical connection between a pair of fixed contacts. A solid state switch electrically connected across the fixed contacts allows the contacts to separate with only a slight arc occurring between the fixed contacts and the bridging contact. The absence of the effects due to arcing allows the contacts to be made much smaller and hence more readily movable. This in turn beneficially allows circuit interruption during the early stages of the current waveform.

By diverting the current through the contacts immediately prior to separation, the contacts can be separated without sufficient current transfer to establish any arc. U.S. patent application Ser. No. 753,832 filed July 11, 1985 and entitled "Arcless Circuit Interrupter" also in the name of E. K. Howell describes one such solid state current interrupter and should be referred to for a good description of the circuits used to effect arcless interruption. When the contacts are separated with insufficient current transfer to establish an arc, the contacts can be made to interrupt the low current value with a minimum separation distance.

The purpose of this invention is to describe a high speed contact driver sufficient to rapidly separate a bridging contact from a pair of fixed contacts by means of the expansion properties of a piezoelectric material when excited by a DC voltage pulse.

SUMMARY OF THE INVENTION

A pair of fixed contacts are electrically connected by a bridging contact to a piezoelectric contact driver bar. A compression spring holds the bridging contact against the fixed contact pair to provide minimum contact resistance. A DC voltage pulse applied transverse to the lineal extent of the piezoelectric bar causes the bar to rapidly expand in its lineal direction driving the bridging contact away from the fixed contact pair. A solid state switch electrically connected in parallel across the fixed contact pair virtually eliminates arc formation across the contacts. This allows the contacts to be made compact and allows the contact current to become interrupted by a small separation distance between the bridging contact and the fixed contact pair.

DESCRIPTION OF THE PREFERRED EMBODIMENT

Figure 1:
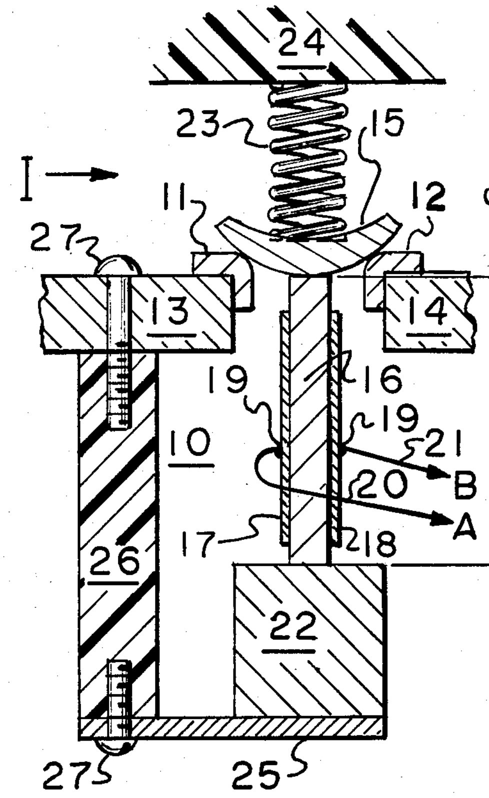
FIG. 1 is a side sectional view of the high speed contact driver according to the invention with the contacts closed.
Figure 2:
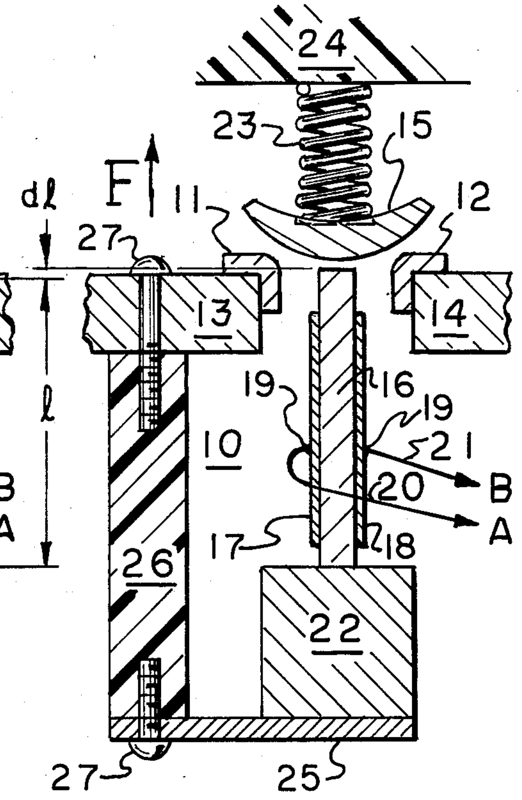
FIG. 2 is a side sectional view of the contact driver depicted in FIG. 1 with the contacts in an open condition.
Figure 3:
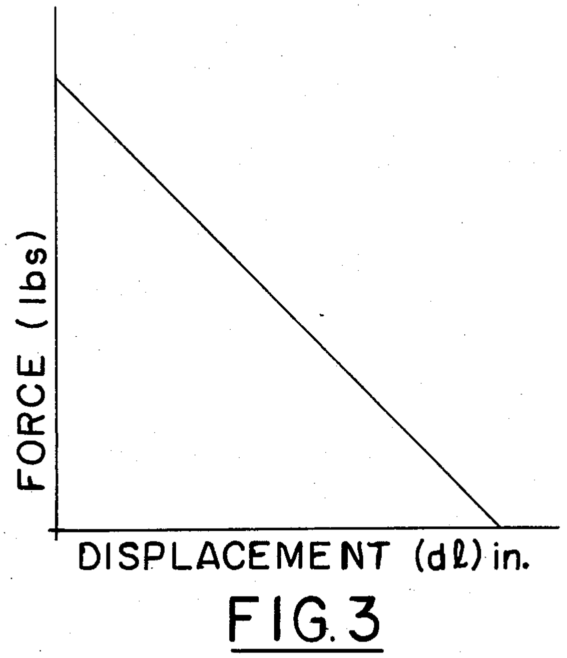
FIG. 3 is the force versus displacement curve for the piezoelectric material.

A high speed contact driver 10 is shown in FIG. 1 arranged between a pair of fixed contacts 11, 12 attached to the ends of conductors 13, 14 with a bridging contact 15 arranged for the transport of current between the conductors as indicated. A piezoelectric contact driver bar 16 made from a piezoelectric ceramic material, such as barium titanate or lead zirconium titanate and including a pair of metallic electrodes 17, 18, abuts the bridging contact 15 at one end. The opposite end of the piezoelectric contact driver bar abuts a metal block 22. The bridging contact is held against the fixed contacts under the bias provided by a compression-type contact spring 23 attached to a fixed support 24. This ensures minimum contact resistance between the bridging contact and the fixed contact pair·such that the current passes between the conductors 13, 14 with minimum heating effects. The metal block 22 is designed to have a mass substantially greater than the mass of the bridging contact 15 so that the bridging contact will rapidly move upon expansion of the piezoelectric contact driver bar and the metal block will remain stationary. The metal block is supported by a cantilever spring 25 which holds the piezoelectric bar in compression and which is attached at an opposite end to the cantilever spring support 26 by means of a screw 27. The opposite end of the cantilever spring support is attached to conductor 13 by means of a separate screw 27. The piezoelectric contact driver bar 16 has an overall length "l" in a relaxed state. A pair of wires 20, 21 are attached to the metal electrodes 17, 18 by means of welding or soldering as indicated at 19. Upon connection to a source of DC voltage by means of terminals A, B, a voltage pulse is applied to the piezoelectric contact driver bar transverse to its longitudinal direction initially creating a high force "F" exerted between the metal block 22 and contact 15 and, ultimately, causing the overall length to increase by an increment "dl" as shown in FIG. 2. The increase in the Force exerted on the contact 15 as a function of the displacement of the piezoelectric bar is shown in FIG. 3. For a small initial displacement, the generated Force is quite high and decreases with further displacement of the bar. In order to interrupt the current through the conductors with insufficient current to sustain an arc, the solid state switch described earlier turns on and the current is first diverted through the solid state switch. The voltage pulse is then applied to the piezoelectric contact driver bar to drive the bridging contact 15 with the force "F" against the contact spring bias and accelerating the bridging contact away from the fixed contact pair in the indicated direction. Although the increase in length "dl" is in the order of a fraction of a thousandth of an inch, the velocity imparted to contact 15 creates a larger separation distance between the bridging contact and the fixed contact pair, shown in FIG. 2, sufficient to interrupt the small amount of current through the conductors 13, 14. When the solid state switch turns off, the separation distance between the fixed contact pair and the bridging contact is sufficient to prevent the current from transferring between the contacts. An auxiliary switch in series with the contacts can be employed to completely interrupt the circuit current when the solid state switch is turned off. In some circuit interrupter designs, it is desirable to hold the bridging contact stationary and to attach the contact pair to the end of the contact driver. In this case, the contact pair are electrically connected to the conductors by means of a flexible braid to allow the contacts to move relative to the fixed bridging contact.

It has thus been shown that a piezoelectric contact driver bar arranged between a bridging contact and a metal block is capable of rapidly driving the bridging contact in a direction away from the block when the contact mass is quite small with respect to the mass of the metal block.

Having described our invention, what I claim as new and desire to secure by Letters Patent is:

1. A contact arrangement for interrupting circuit current comprising:

a pair of fixed contacts for connection within an electric circuit;

a bridging contact arranged across said fixed contacts for transport of circuit current between said fixed contacts;

a contact driver arranged to exert a force between said fixed contacts and said bridging contact, said contact driver comprising voltage responsive means whereby a voltage pulse applied to said contact driver moves said bridging contact away from said fixed contacts to interrupt said current, said contact driver comprising a piezoelectric bar having a pair of electrodes attached to either side of said bar, said bridging contact abutting one end of said piezoelectric bar, and a block abutting an opposite end of said piezoelectric bar, the mass of said block being greater than the mass of said contact for enhancing motion of said contact relative to said block, said block being attached to an insulating support arranged parallel to said piezoelectric bar, said block being attached to said insulating support by means of a cantilever spring.

* * * * *